(12) United States Patent
Kolasinski et al.

(10) Patent No.: US 12,106,968 B2
(45) Date of Patent: Oct. 1, 2024

(54) INJECTION METAL ASSISTED CATALYTIC ETCHING

(71) Applicant: Ram Nanotech, Incorporated, Malvern, PA (US)

(72) Inventors: Kurt W. Kolasinski, West Chester, PA (US); Bret Unger, Berkeley, CA (US)

(73) Assignee: Ram Nanotech, Incorporated, Malvern, PA (US)

( * ) Notice: Subject to any disclaimer, the term of this patent is extended or adjusted under 35 U.S.C. 154(b) by 764 days.

(21) Appl. No.: 16/944,363

(22) Filed: Jul. 31, 2020

(65) Prior Publication Data

US 2021/0035811 A1 Feb. 4, 2021

Related U.S. Application Data

(60) Provisional application No. 62/881,636, filed on Aug. 1, 2019.

(51) Int. Cl.
*H01L 21/306* (2006.01)
*C09K 13/12* (2006.01)

(52) U.S. Cl.
CPC ........ *H01L 21/30604* (2013.01); *C09K 13/12* (2013.01)

(58) Field of Classification Search
CPC .......................... H01L 21/30604; C09K 13/12
See application file for complete search history.

(56) References Cited

U.S. PATENT DOCUMENTS 5,851,925 A * 12/1998 Beh .......................... G01N 1/32
438/712
6,790,785 B1 9/2004 Li et al.
(Continued)

FOREIGN PATENT DOCUMENTS

EP 2321441 5/2011
EP 3379584 A1 * 9/2018 ....... H01L 31/02363
(Continued)

OTHER PUBLICATIONS

Wikipedia "Silver nitrate" via https://web.archive.org/web/20180517230424/https://en.wikipedia.org/wiki/Silver_nitrate ; pp. 1-4 (Year: 2018).*
(Continued)

*Primary Examiner* — Binh X Tran
(74) *Attorney, Agent, or Firm* — Vos-IP, LLC

(57) ABSTRACT

An electroless etching process. The process produces nanostructured semiconductors in which an oxidant ($Ox_1$) is deposited as a metal on a semiconductor surface and used as a catalytic agent to facilitate reaction between a semiconductor and a second oxidant ($Ox_2$). $Ox_2$ is used to initiate etching by injecting holes into the semiconductor valence band as facilitated by the catalytic action of the deposited metal. The extent of reaction is controlled by the amount of $Ox_2$ added; the reaction rate is controlled by the injection rate of $Ox_2$. The process produces high specific surface area and/or hierarchically structured porous Si with higher and controllable yield. In addition, the ability is demonstrated to vary the pore size distribution of mesoporous silicon including producing hierarchically structured mesoporous silicon with more than one peak in the pore size distribution. In principle, the process applies to any semiconductor onto which metal can be deposited galvanically.

15 Claims, 17 Drawing Sheets

(56) References Cited

U.S. PATENT DOCUMENTS

| | | |
|---|---|---|
| 7,244,513 B2 | 7/2007 | Li et al. |
| 7,569,202 B2 | 8/2009 | Farrell et al. |
| 9,184,438 B2 | 11/2015 | Green et al. |
| 9,540,246 B2 | 1/2017 | Canham et al. |
| 9,871,244 B2 | 1/2018 | Green et al. |
| 9,871,248 B2 | 1/2018 | Rayner et al. |
| 10,590,562 B2 | 3/2020 | Kolasinski et al. |
| 2004/0214085 A1 | 10/2004 | Sheem et al. |
| 2008/0260839 A1 | 10/2008 | Canham et al. |
| 2009/0186267 A1 | 7/2009 | Tiegs |
| 2013/0216907 A1* | 8/2013 | Rayner .............. B22F 1/06 241/24.1 |
| 2014/0162131 A1* | 6/2014 | Friend ............... H01M 4/1397 429/232 |
| 2015/0050556 A1* | 2/2015 | Liu .................... H01M 4/134 216/13 |
| 2016/0308205 A1 | 10/2016 | Canham et al. |
| 2018/0198116 A1 | 7/2018 | Aurora et al. |
| 2019/0312112 A1* | 10/2019 | Smith ................ B01D 69/02 |
| 2020/0338528 A1* | 10/2020 | Dong ................. B01J 20/3078 |

FOREIGN PATENT DOCUMENTS

| | | | | |
|---|---|---|---|---|
| GB | 2516318 A | * | 1/2015 | ............ C09K 13/08 |
| JP | 2021102544 A | * | 7/2021 | |
| WO | 2007/037787 | | 4/2007 | |
| WO | 2010/040985 | | 4/2010 | |

OTHER PUBLICATIONS

Wikipedia "Ammonium nitrate" via https://en.wikipedia.org/wiki/Ammonium_nitrate ; pp. 1-9 (Year: 2024).*

Chadwick et al., "Compositional characterisation of metallurgical grade silicon and porous silicon nanosponge particles," RSC Advances (2013) 3(42):19393-402.

Chadwick et al., "Microstructural characterisation of metallurgical grade porous silicon nanosponge particles," J Mater. Sci. (2012) 47:2396-2404.

Dudley et al., "Stain etching with Fe(III), V(V) and Ce(IV) to form microporous silicon," Electrochem. Solid State Lett. (2009) 12:D22-D26.

Fontana et al., "Platelet lysate-modified porous silicon microparticles for enhanced cell proliferation in wound healing applications," CS Appl Mater Interfaces (2016) 8:988-96.

Kolasinski et al., "A test of Marcus theory predictions for electroless etching of silicon," J Phys. Chem. C (2012) 116:21472-81.

Kolasinski, "Charge transfer and nanostructure formation during electroless etching of silicon," J Phys. Chem. C (2010) 114:22098-05.

Kolasinski et al., "Regenerative Electroless Etching of Silicon," Angew. Chem., Int. Ed Engl. (2017) 56:624-27.

Kolasinski et al., "The stoichiometry of electroless silicon etching in solutions of V2Os and HF," Angew. Chem., Int. Ed Engl. (2013) 52:6731-34.

Li et al., "Black metallurgical silicon for solar energy conversion," Semicond Sci. Technol. (2016) 31:1-15.

Limaye et al., "Scaleable synthesis route for silicon nanocrystal assemblies," Phys. Status Solidi A (2007) 204:1297-1301.

Loni et al., "Extremely high surface area metallurgical-grade porous silicon powder prepared by metal-assisted etching," Electrochem. Solid State Lett. (2011) 14:K25-K27.

Nahidi et al., "The effects of stain etchant composition on the photoluminescence and morphology of porous silicon," J Electrochem. Soc., (2006) 153:CI9-C26.

Santos et al., "Multifunctional porous silicon for therapeutic drug delivery and imaging," Current Drug Discovery Technologies (2011) 8:228-49.

Turner et al., "Delivery of flightless I siRNA from porous silicon nanoparticles improves wound healing in mice," ACS Biomater. Sci. Eng. (2016) 2:2339-2346.

Wang et al., "Multifunctional porous silicon nanoparticles for cancer theranostics," Biomaterials (2015) 48:108-18 (2015).

Wang et al., "Stain etched nanostructured porous silicon: The role of morphology on antibacterial drug loading and release," Silicon (2016) 8:525-31.

Zhang et al., "Fabrication of a multifunctional nano-in-micro drug delivery platform by microfluidic templated encapsulation of porous silicon in polymer matrix," Adv. Mater. (2014) 26:4497-4503.

Kurt W. Kolasinski, Laser-assisted restructuring of silicon over nano-, meso-, and macro-scales, Recent Research Advances in Applied Physics, 2004, p. 267-292, 7, Transworld Research Network, Kerala, India.

Kurt W. Kolasinski, Silicon nanostructures from electroless electrochemical etching, Current Opinion in Solid State and Materials Science, 2005, p. 73-83, 9(1-2), Elsevier, USA.

Kurt W. Kolasinski, David Mills, Mona Nahidi, Laser assisted and wet chemical etching of silicon nanostructures, Journal of Vacuum Science and Technology A, 2006, p. 1474-1479, 24(4), American Institute of Physics, USA.

Kurt W. Kolasinski, Metal-assisted catalytic etching (MACE) for nanofabrication of semiconductor powders, Micromachines, 2021, p. 776, 12(7), MDPI, Basel, Switzerland.

Kurt W. Kolasinski, Electron transfer during metal-assisted and stain etching of silicon, Semiconductor Science and Technology, 2015, p. 1-9, 31, IOP, UK.

Konstantin Tamarov, Joseph D. Swanson, Bret A. Unger, Kurt W. Kolasinski, Alexis T. Ernst, Mark Aindow, Vesa-Pekka Lehto, Joakim Riikonen, Controlling the nature of etching Si nanostructures: high-versus low-load metal-assisted catalytic etching (MACE) of Si powders, Applied Materials and Interfaces, 2020, p. 4787-4796, 12(4), ACS, USA.

Konstantin Tamarov, Riku Kiviluoto, Joseph D. Swanson, Bret A. Unger, Alexis T. Ernst, Mark Aindow, Joakin Riikonen, Vesa-Pekka Lehto, Kurt W. Kolasinski, Low-load metal-assisted catalytic etching produces scalable porosity in Si powders, Applied Materials and Interfaces, 2020, p. 48969-48981, 12(43), ACS, USA.

Zhipeng Huang, Nadine Geyer, Peter Werner, Johannes De Boor, Ulrich Gösele, Metal-assisted chemical etching of silicon: a review, Advanced Materials, 2011, p. 285-308, 23(2), Wiley, Weinheim, Germany.

* cited by examiner

INJECTION METAL ASSISTED CATALYTIC ETCHING

STATEMENT REGARDING FEDERALLY SPONSORED RESEARCH

This invention was made with government support under Grant No. CMMI-182533 awarded by the National Science Foundation. The government has certain rights in the invention.

TECHNICAL FIELD

The present technology is generally related to a method for producing nanostructured semiconductors. In particular, the technology is related to porous semiconductor particles and hierarchically porous semiconductor particles prepared from electronics-grade, metallurgical-grade, or other semiconductor-comprising powders.

BACKGROUND OF THE TECHNOLOGY

Applications of nanostructured semiconductors can be economically pursued with the use of semiconductor-grade wafers if the product can be produced in no other way, e.g., integrated circuits, or if the product cost is not a factor, e.g., highly specialized applications such as aerospace, deep space, military, and some medical applications. However, numerous applications of nanostructured semiconductors, e.g., consumer products, high-energy materials, lighting, secondary (e.g., lithium ion) batteries, sensors, thermoelectric materials, and nano- or meso-porous filters, would benefit from economical production of porous powder on the kilogram to ton scale. Porous silicon in particular has been demonstrated to have especially appealing properties to be used in theranostics (Wang et al., Multifunctional porous silicon nanoparticles for cancer theranostics, *Biomaterials*, 48, 108-18 (2015)), nanomedicine (Fontana et al., Platelet lysate-modified porous silicon microparticles for enhanced cell proliferation in wound healing applications, *ACS Appl Mater Interfaces*, 8, 988-96 (2016)), drug delivery (Zhang et al., Fabrication of a multifunctional nano-in-micro drug delivery platform by microfluidic templated encapsulation of porous silicon in polymer matrix, *Adv. Mater.*, 26, 4497-4503 (2014)), biomedical imaging (Santos et al., J., Multifunctional porous silicon for therapeutic drug delivery and imaging, *Current Drug Discovery Technologies*, 8, 228-49 (2011)), and wound care (Turner et al., *ACS Biomater. Sci. Eng.*, Delivery of flightless I siRNA from porous silicon nanoparticles improves wound healing in mice, 2, 2339 (2016)), if only the porous silicon could be made in bulk quantities.

Electroless etching of metallurgical-grade Si ($1 kg$^{-1}$ versus $10,000 kg$^{-1}$ for semiconductor-grade Si) is recognized as a process with tremendous industrial potential but only if issues related to reproducibility, controllability, purity, cost, and scaling can be addressed, see, for example, Li et al., Black metallurgical silicon for solar energy conversion, *Semicond. Sci. Technol.*, 31, 014009 (2016); Chadwick et al., Compositional characterisation of metallurgical grade silicon and porous silicon nanosponge particles, *RSC Adv*, 3, 19393-402 (2013); and Loni et al., Extremely high surface area metallurgical-grade porous silicon powder prepared by metal-assisted etching, *Electrochem. Solid State Lett.*, 14, K25-K27 (2011). $HNO_3$-based processes suffer from difficulty to produce specific surface areas greater than 150 m$^2$ g$^{-1}$, incomplete etching of particles, and a yield of 5%. Chadwick et al. (2013); Chadwick et al., Microstructural characterisation of metallurgical grade porous silicon nanosponge particles, *J. Mater. Sci.*, 47, 2396-2404 (2012); and Limaye et al., Scaleable synthesis route for silicon nanocrystal assemblies, *Phys. Status Solidi A*, 204, 1297-1301 (2007).

A major advance in stain etching was the discovery by Kurt W. Kolasinski and co-workers (Nahidi & Kolasinski, The effects of stain etchant composition on the photoluminescence and morphology of porous silicon, *J. Electrochem. Soc.*, 153, C19-C26 (2006); and Dudley & Kolasinski, Stain etching with Fe(III), V(V) and Ce(IV) to form microporous silicon, *Electrochem. Solid State Lett.*, 12, D22-D26 (2009)) that $HNO_3$ could be replaced by oxidants that produce significantly less gas during etching. Replacement of $HNO_3$ by $Fe^{3+}$ led to production of powders with much greater specific surface area (up to 408 m$^2$ g$^{-1}$) and improved yield ($\eta \leq 0.24$, defined as the ratio of final mass to initial mass) by Loni et al. (2011) and Wang et al., Stain etched nanostructured porous silicon: The role of morphology on antibacterial drug loading and release, *Silicon*, 8, 525-31 (2016). Such replacement failed to resolve issues, however, with process control (particularly regarding thermal budget, drying, and salt precipitation, see U.S. Pat. No. 9,540,246 issued to Canham and Loni), as well as cost. Kolasinski and co-workers further demonstrated that $V_2O_5$, which is not a metal salt but an oxide, dissolved in HF etches Si without a concentration threshold, without an induction time, that the oxidant it produces in solution is optimally coupled to the Si valence band for maximum etch rate, and that with control of gas production rate and drying conditions homogeneous films of roughly 20 µm depth could be obtained on etched wafers (Kolasinski et al., A test of Marcus theory predictions for electroless etching of silicon, *J. Phys. Chem. C*, 116, 21472-81 (2012); Kolasinski, Charge transfer and nanostructure formation during electroless etching of silicon, *J. Phys. Chem. C*, 114, 22098-05 (2010); and Dudley & Kolasinski (2009) as well as Kolasinski et al., U.S. Pat. No. 10,590,562 B2).

In U.S. Pat. No. 7,244,513, Li and Pavlovsky describe a porous silicon powder comprising individual silicon particles wherein only the outermost layer of each individual particle is porous. The porous layer has a maximum thickness of only 500 nm. Farrell et al. report, in International Patent Application Publication No. WO 2007/037787 and U.S. Pat. No. 7,569,202 B2, etching porous silicon particles having sizes ranging from about 1 µm to about 4 µm that comprise a solid core surrounded by a porous silicon layer having a thickness greater than about 0.5 microns on the particles. In the disclosed processes a stain etching method is used. In neither of these patent references were the porous silicon particles etched completely to the core.

In U.S. Patent Application Publication No. 2009/0186267, Tiegs describes using the method of Farrell et al. to produce an anode in a lithium ion battery. Canham and Aston disclose, in U.S. Patent Application Publication No. 2008/0260839, performing stain etching after lithographic patterning of a silicon wafer to produce porous silicon cubic particles. Rayner and Loveridge (U.S. Pat. No. 9,871,248), Sheem et al. (U.S. Patent Application Publication No. 2004/0214085), and Canham and Friend (U.S. Patent Application Publication No. 2016/0308205) produced non-luminescent porous silicon particles by acid leaching of the metal component, e.g., aluminum, of a metal/silicon alloy particle. Aurora et al. (U.S. Patent Application Publication No. 2018/0198116 A1) produced non-luminescent microporous silicon/$Al_2O_3$ composite particles mixing silica with aluminum as a metal reducing agent. The composite material is then thermally treated and a portion of the alumina is removed by etching.

An alternative method of etching silicon to produce porous silicon powder, known as ReEtching, was addressed in U.S. Pat. No. 10,590,562 B2. The ReEtch cycle for etching of silicon, Si, employs a vanadium ion in a +5 oxidation state, denoted V(V) in FIG. 1(a). The V(V) ion injects a hole, $h^+$, into the silicon valence band and is reduced to a vanadium ion in the +4 oxidation state, V(IV). The hole initiates the etching of silicon atoms to form a pore in the substrate. The product of the etching reaction is $SiF_6^{2-}$. Injected hydrogen peroxide, $H_2O_2$, removes an electron from V(IV) to regenerate V(V) so that the cycle can begin again.

An alternative method of etching silicon and other semiconductors involves the use of a metal to catalyze the reduction of an oxidant. This method is called variously metal-assisted etching, metal-assisted chemical etching, and metal-assisted catalytic etching. In the literature these names are abbreviated as MAE, MacEtching, or MACE. MACE faces economic challenges as the result of low product yield of only a few (single digit) percent and the use of a substantial amount of precious metals such as Ag, Au, Pd, Pt, Rh, Ru, and Ir. Li et al. (U.S. Pat. No. 6,790,785) disclosed metal assisted etching of silicon wafers rather than powders. They do not claim control of pore size nor address the low yield of porous silicon. A family of patents obtained by Green et al. (e.g., U.S. Pat. Nos. 9,184,438 and 9,871,244 B2 and related EP Patent No. 2 321 441 and International Patent Application Publication No. WO 2010/040985) disclosed production of silicon particles, of which 10-50% of the surface is covered by pillars (alternately claimed to be silicon nanowire-covered particles) by MACE of silicon powders in which the pillars are crystalline. Low yield and the use of a high load of silver (Ag) or other precious metals as the catalyst greatly increases the cost of the MACE process as previously disclosed. Therefore, minimization of Ag usage is a desirable goal. MACE as disclosed and previously performed suffers from very low yield on the order of one to a few percent of nanostructured Si particles. For broader and more economical applications of porous silicon particles, there is a clear need for lower metal loading, higher and controllable yield and the ability to vary the pore size distribution.

SUMMARY OF THE INVENTION

The present invention meets the need for an improved process for producing high specific surface area, photoluminescent porous Si (por-Si) with higher and controllable yield. In addition, the ability is demonstrated to vary the pore size distribution of mesoporous silicon including producing hierarchically structured mesoporous silicon with more than one peak in the pore size distribution. In principle, the invention is applicable to any semiconductor onto which metal can be deposited galvanically from solution.

FIG. 1(b) depicts an embodiment of the disclosed injection MACE cycle for etching Si, denoted iMACE. In such a cycle, injected $H_2O_2$ removes an electron from a metal nanoparticle, M, which then injects a hole into the silicon substrate. The hole initiates the etching of silicon forming the etch product $SiF_6^{2-}$, to form a pore in the substrate.

In certain embodiments, nanoparticles of any metal with a positive standard reduction potential E° could be deposited galvanically, including W, Re, Bi, Cu, Po, Ru, Hg, Ag, Au, Pd, Pt, Rh, Ir, and Tl. Metals with a negative E° such as Fe, Se, Pb, Sn, In, Mo, Ga, Ni, Co, Ta, Cr, and Zn would have to be deposited by some other method, e.g., evaporation or chemical vapor deposition. Metals such as W, Re, Bi, Cu, Po, and Ru that have E°<0.6 will have slow kinetics for deposition as the metal onto the Si particles. These metals as well as metals with a negative E° will also be susceptible to rapid dissolution in the presence of $H_2O_2$ in solution. The toxicities of Hg and Tl make them less attractive.

In certain embodiments, the invention uses a catalytic amount of metal deposited from an aqueous solution containing HF onto silicon powder dispersed in a solution containing acetic acid. The addition of acetic acid and the use of a pump to inject the dissolved metal ions at a controlled rate were found to allow for precise control of the amount of deposited metal as well as making the deposited layer more uniform. The deposited metal nanoparticles act as a catalyst for the reduction of an oxidant. The oxidant is injected at a controlled rate with a pump in a manner described by Kolasinski, K. W., Gimbar, N. J., Yu, H., Aindow, M., Mäkilä, E. & Salonen, J., Regenerative Electroless Etching of Silicon, *Angew. Chem., Int. Ed. Engl.*, 56, 624-27 (2017), and in Kolasinski et al., U.S. Pat. No. 10,590,562 B2. The oxidant, as illustrated in FIG. 1(b), initiates etching by removing an electron from the metal, which then removes an electron from silicon, a process that is also called hole injection into the silicon valence band. Hole injection into the silicon valence band is a necessary condition for nanostructuring, as described in Kolasinski & Barclay, The stoichiometry of electroless silicon etching in solutions of $V_2O_5$ and HF, *Angew. Chem., Int. Ed. Engl.*, 52, 6731-34 (2013). Importantly, the improved process allows the use of $H_2O_2$ (~$0.5 kg^{-1}$), an oxidant that is known not to produce porous Si in the absence of a metal particle catalyst, which simultaneously enhances economic viability and process control by facilitating easier thermal management, greater control over the etch rate, greater control over the extent of etching, and elimination of precipitation of impurities onto the porous powder.

More generally, disclosed is a process of electroless etching to produce porosified or hierarchically porosified semiconductor particles. The process includes the steps of: (a) providing electronics-grade, metallurgical-grade, or other semiconductor-comprising powders; (b) injecting a first oxidant, which is a metal that deposits on the surface of the semiconductor; (c) injecting a second oxidant; and (d) initiating through addition of the second oxidant nanostructure formation. This process is called injection metal assisted catalytic etching or iMACE to emphasize the importance of the injection of reagents.

It is to be understood that both the foregoing general description and the following detailed description are exemplary, but are not restrictive, of the disclosure.

BRIEF DESCRIPTION OF THE DRAWING

The invention is best understood from the following detailed description when read in connection with the accompanying drawing. Included in the drawing are the following figures.

DETAILED DESCRIPTION OF THE DISCLOSURE

Figure 1A:
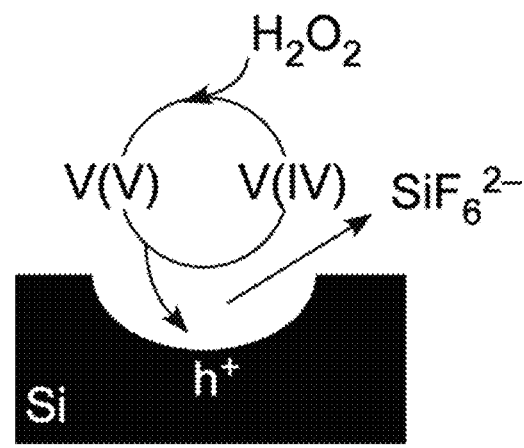
FIG. 1(a) illustrates the ReEtch cycle for etching of silicon, Si.

FIG. 1(a) illustrates the ReEtch cycle for etching of silicon, Si. A vanadium ion in a +5 oxidation state, denoted V(V), injects a hole, $h^+$, into the silicon valence band and is reduced to a vanadium ion in the +4 oxidation state, V(IV). The hole initiates the etching of silicon atoms to form a pore in the substrate. The product of the etching reaction is $SiF_6^{2-}$. Injected hydrogen peroxide, $H_2O_2$, removes an electron from V(IV) to regenerate V(V) so that the cycle can begin again.

Figure 1B:
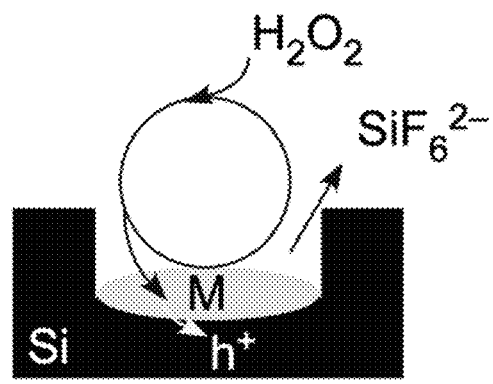
FIG. 1(b) illustrates the injection MACE cycle for etching Si, denoted iMACE.

FIG. 1(b) illustrates the injection MACE cycle for etching Si, denoted iMACE. Injected $H_2O_2$ removes an electron from a metal nanoparticle, M, which then injects a hole into the silicon substrate. The hole initiates the etching of silicon forming the etch product $SiF_6^{2-}$, to form a pore in the substrate.

Semiconductor dissolution and nanostructuring initiated by valence band hole injection is not limited to silicon but is a general process applicable to any semiconductor. The chemical identity of the first oxidant, $Ox_1$, is a metal with a positive standard reduction potential, e.g., W, Re, Bi, Cu, Po, Ru, Hg, Ag, Au, Pd, Pt, Rh, Ir, and Tl. The chemical identity of the second oxidant, $Ox_2$, may include, but is not limited to, $H_2O_2$, $VO_2^+$, $Ce^{4+}$, nitrates (including $HNO_3$ and $Fe(NO_3)_3$), nitrites, $NO_2^-$, $NOBF_4$, $NOHSO_4$, $MnO_4^-$, dihalogens (e.g., $Br_2$ and $I_2$), halogenates (e.g., $IO_3^-$), $IrCl_6^{2-}$, $Fe^{3+}$, $S_2O_8^{2-}$, $HCrO_4^-$, $ClO_4^-$, $Co^{3+}$, $Ru(CN)_6^{3-}$, and $UO_2^+$. Preferentially, the second oxidant is $H_2O_2$.

In certain embodiments, injection of $Ox_2$ at a steady rate lowers the steady-state concentration of $Ox_2$ during the reaction, which has the added benefit that it makes $Ox_2$ less likely to dissolve the metal catalyst.

A number of semiconductors have a valence band maximum (VBM) that lies at or is less positive than an electrochemical potential of 1.8 V versus the standard hydrogen electrode (SHE), which is approximately equal to the standard electrode potential of $H_2O_2$, which is 1.78 V. This positioning of the valence band maximum facilitates rapid hole injection from the oxidant and the initiation of electroless etching. Therefore, the process described in this document can in principle be used to produce porosified and hierarchical semiconductors in, e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, and $Sb_2Se_3$ from electronics-grade, metallurgical-grade, or other silicon-comprising or semiconductor-comprising powders.

Similarly, although the specific examples described below pertain to substrates that comprise silicon, the process is general to all semiconductors and semiconductor-comprising powders with an appropriately positioned valence band maximum.

It is the position of the valence band maximum with respect to the Nernstian potential of the oxidant $E_{ox}$ that is important. The Nernst equation, $E_{ox}=E°-(RT/zF)\ln Q$, defines this potential in terms of the standard potential $E°$, gas constant R, temperature T, electron number z, Faraday constant F, and reaction quotient Q. Therefore, the Nernstian potential of the oxidant depends both on the choice of oxidant and control of the reaction conditions through Q.

Figure 2A:
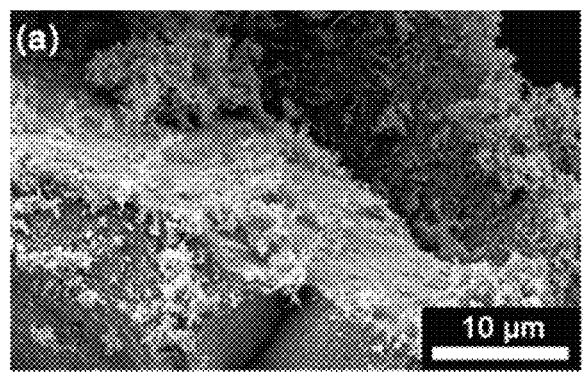
FIGS. 2(a)-(f) show that, by performing the deposition step with injection of the metal salt, metal deposition can be controlled and made more uniform.
Figure 2B:
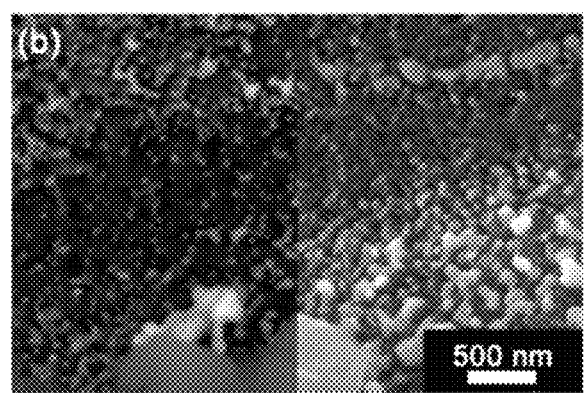
Figure 2C:
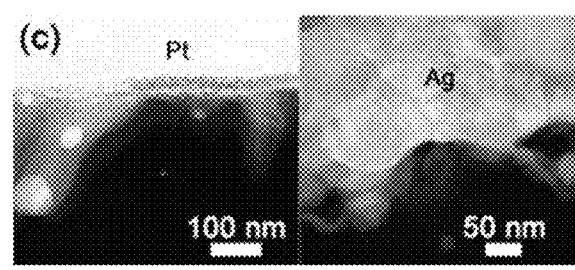
Figure 2D:
Figure 2E:
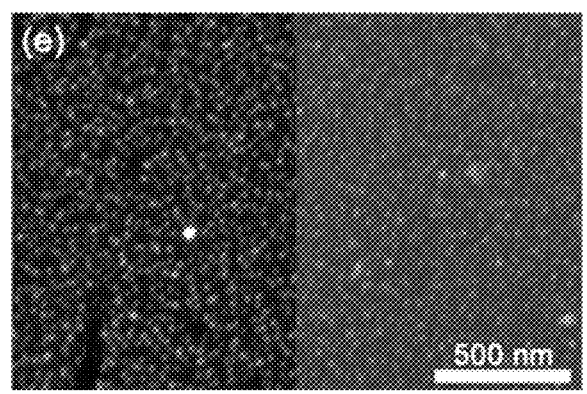

FIGS. 2(a)-(f) show that, by performing the deposition step with injection of the metal salt, metal deposition can be controlled and made more uniform. SEM (a, b, d, e) and HAADF STEM (c,f) images are included of: (a-c) 4.8 mmol of deposited Ag, and (d-f) 0.025 mmol of deposited Ag on the surfaces of MG Si particles. The darker left sides and brighter right sides of FIG. 2(b) and FIG. 2(e) are backscattered and secondary electron images, respectively. The cross-sections in FIG. 2(c) reveal a thick layer of Ag, a roughened Si surface, and etch tracks formed during deposition. The cross-sections in FIG. 2(f) reveal small Ag particles confined to the near-surface region. The Pt layers shown in FIG. 2(c) and FIG. 2(f) were used to preserve surface morphology during ion-beam cross sectioning.

Figure 2F:
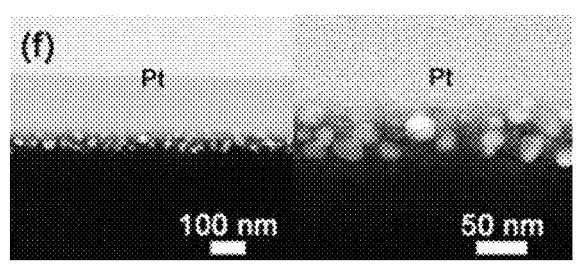

FIGS. 2(a)-(f) demonstrate the well-behaved deposition of metal onto silicon powder afforded by injection of the first oxidant, which contains a dissolved form of the metal. Under high-load (HL) conditions, as shown in FIGS. 2(a)-(c), the metal deposits as discreet particles as well as larger aggregates and dendrites. Some of the metal nanoparticles begin to etch into the silicon substrate during deposition. Under low-load (LL) conditions, as shown in FIGS. 2(d)-(f), the metal deposits uniformly as nanoparticles that are distributed randomly over the surface. The extent of etching into the silicon substrate is substantially less than under HL conditions and no dendrites are formed.

iMACE of Si powders was investigated by varying the amount of deposited Ag over a wide range, from 4.8 mmol to 0.001 mmol per 1 g of Si powder. Thus, the metal amount to surface area ratio, defined by $MAR=n(Ag)/A_{Si}$, varied from 11.4 $mmol \cdot m^{-2}$ to 0.0024 $mmol \cdot m^{-2}$ for 44-75 μm Si particles, where $A_{Si}$=0.42 $m^2 g^{-1}$ is the Brunauer-Emmett-Teller (BET) specific surface area. Furthermore, should powder with a different size distribution be used as the staring material, it is the amount of metal deposited per unit area rather than per unit mass that is the parameter that distinguishes attainment of the HL versus LL regime. Such experiments indicate that Ag, Au, Pd, and Pt all exhibit efficient etching in both the HL and LL regimes. The experiments also indicate that Cu, because of its less positive $E°$ value, is more difficult to operate in the HL regime but etches efficiently in the LL regime.

Figure 3A:
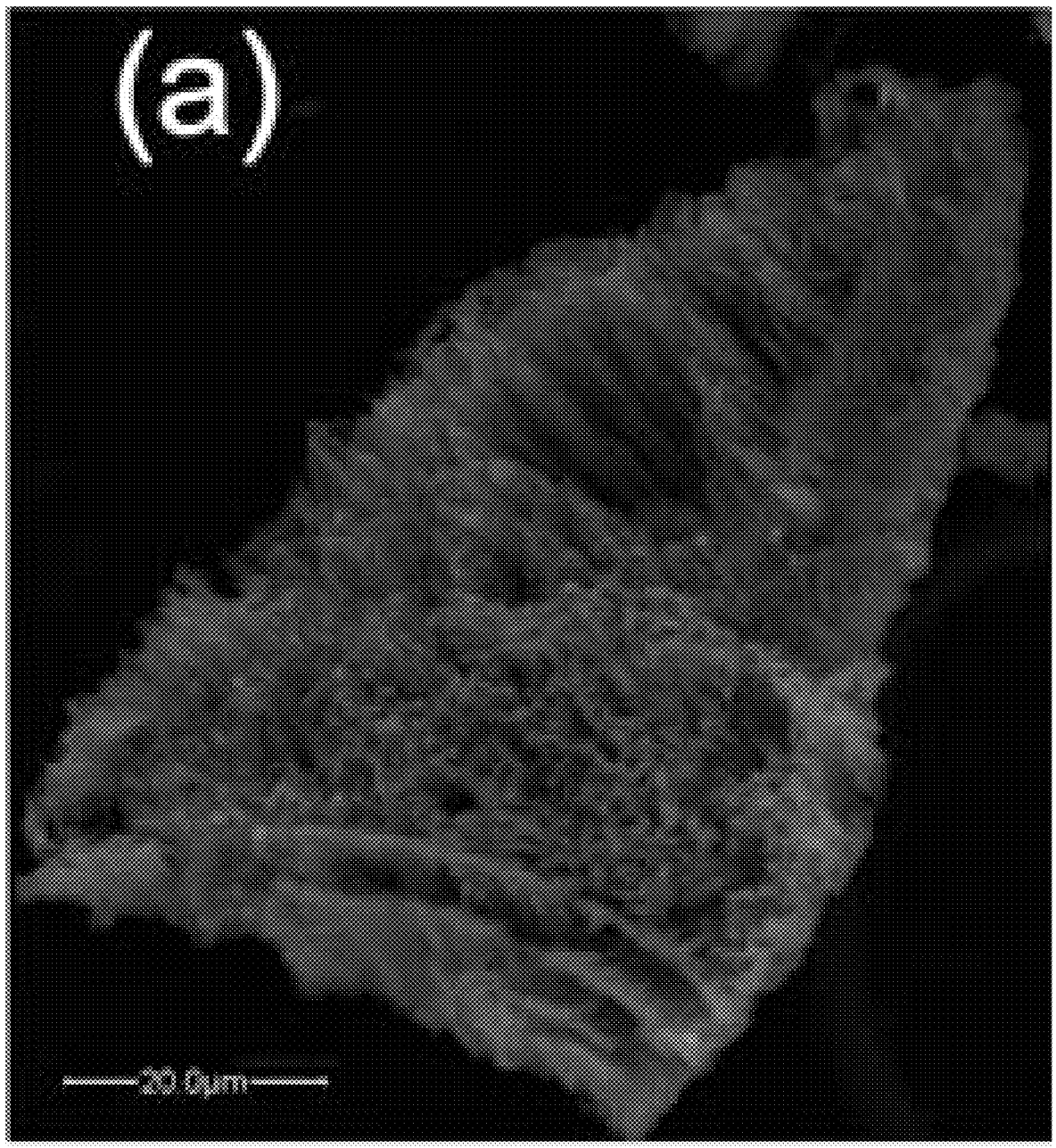
FIGS. 3(a)-(f) compare of typical powder particle structures formed by high-load iMACE (HL-iMACE) and low-load iMACE (LL-iMACE)
Figure 3B:
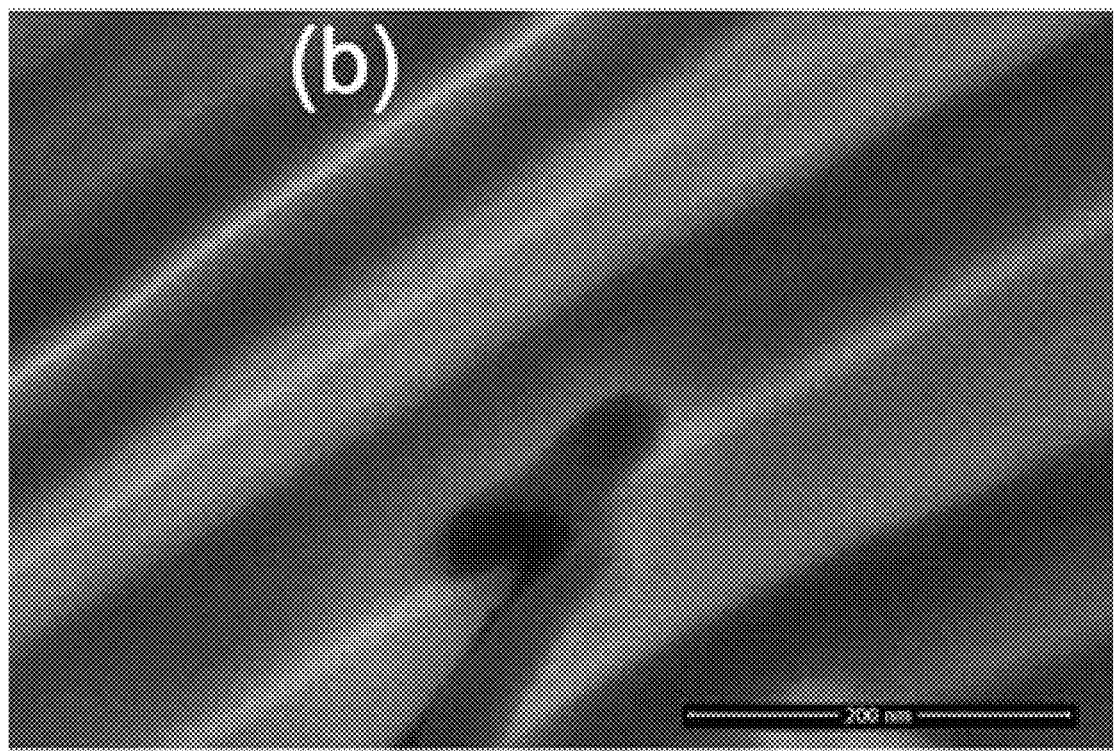
Figure 3C:
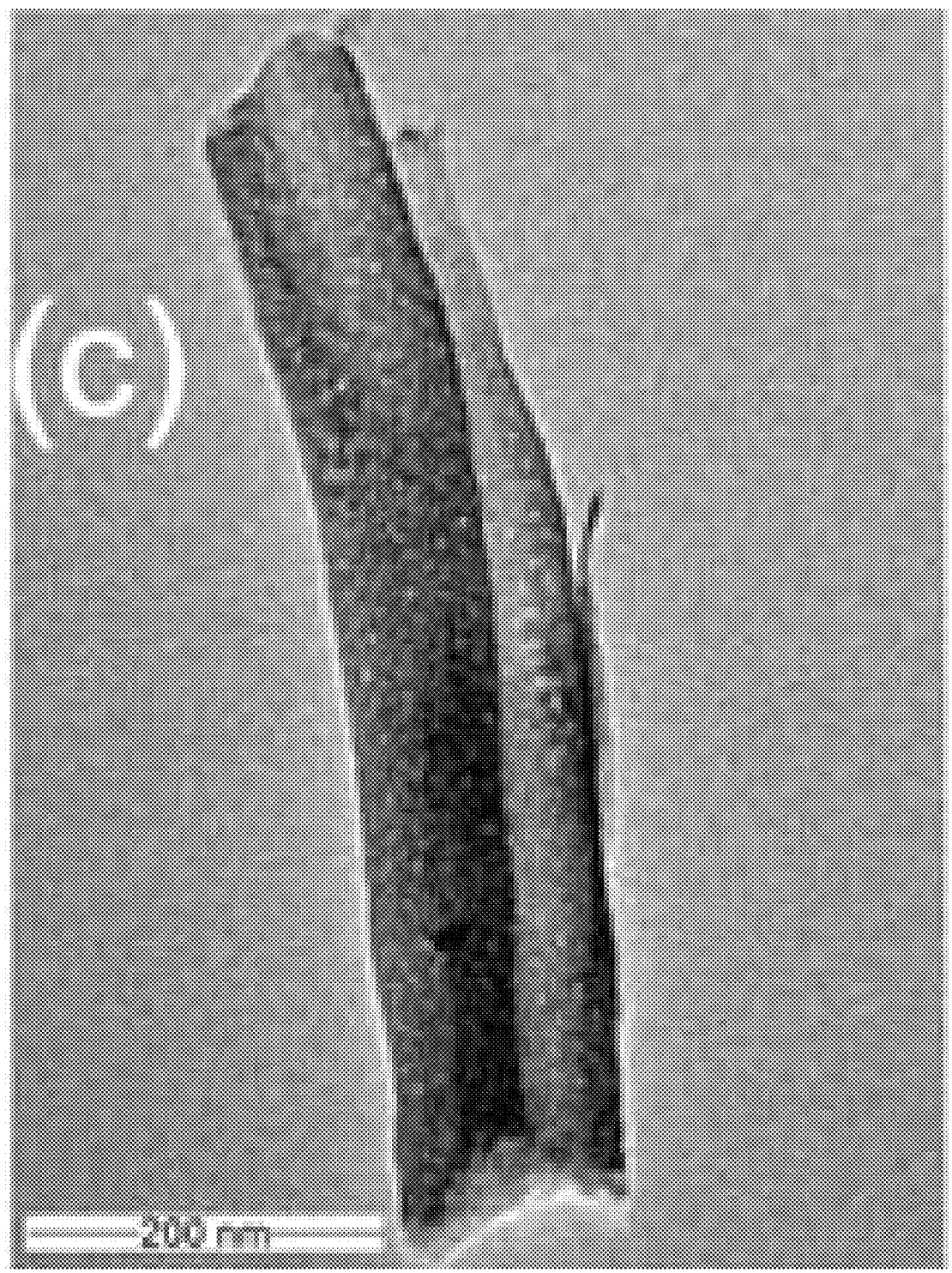
Figure 3D:
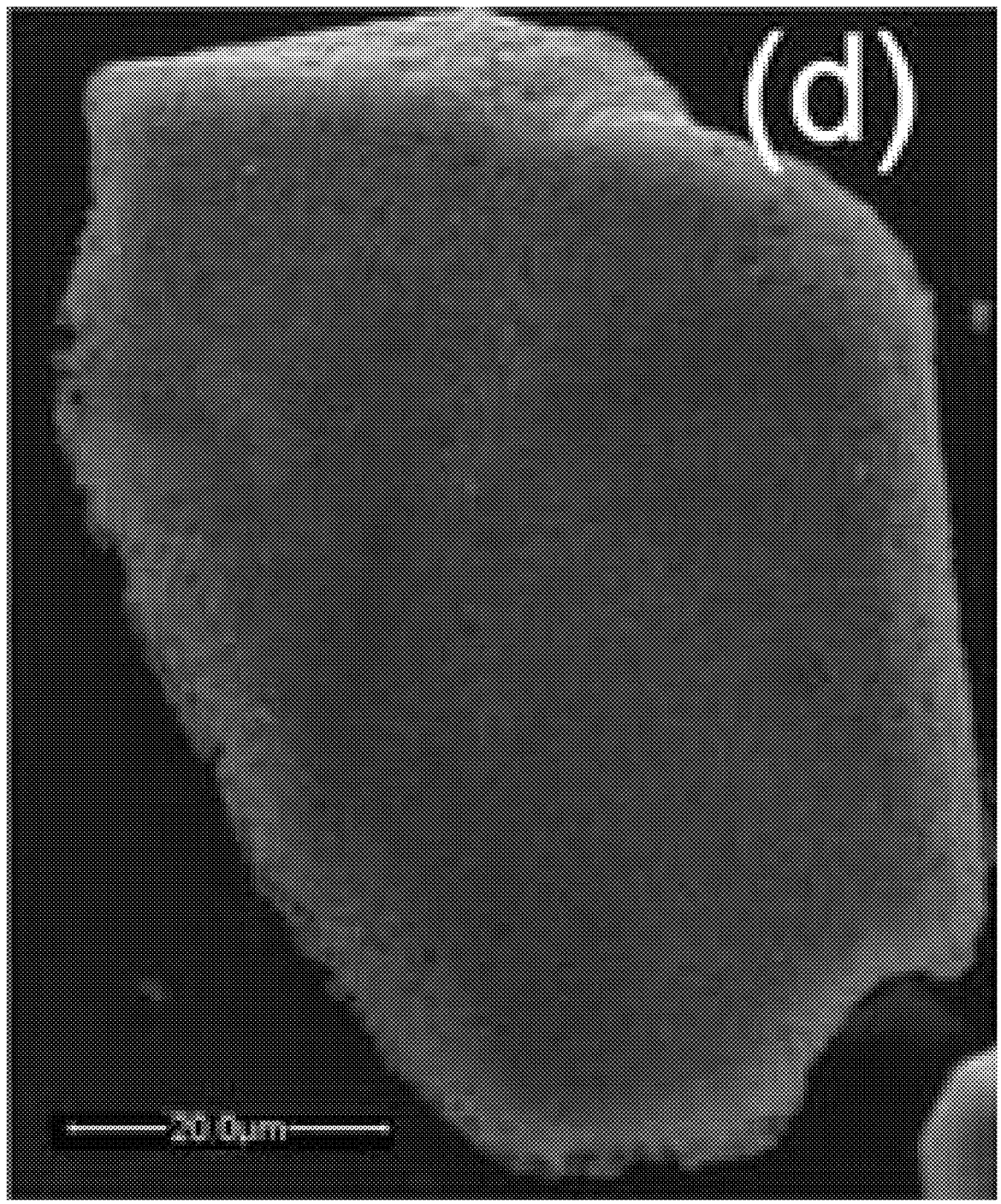
Figure 3E:
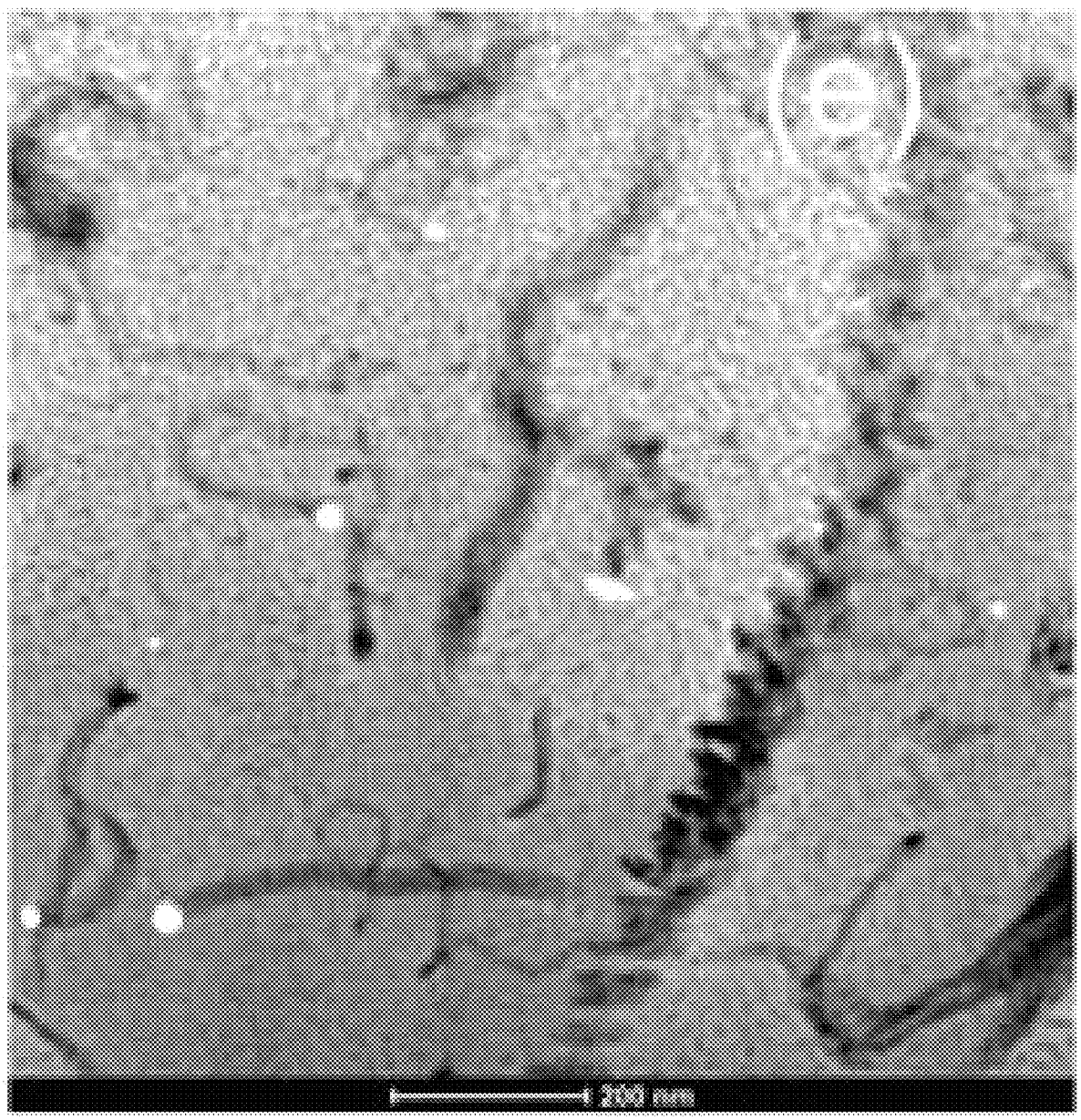
Figure 3F:
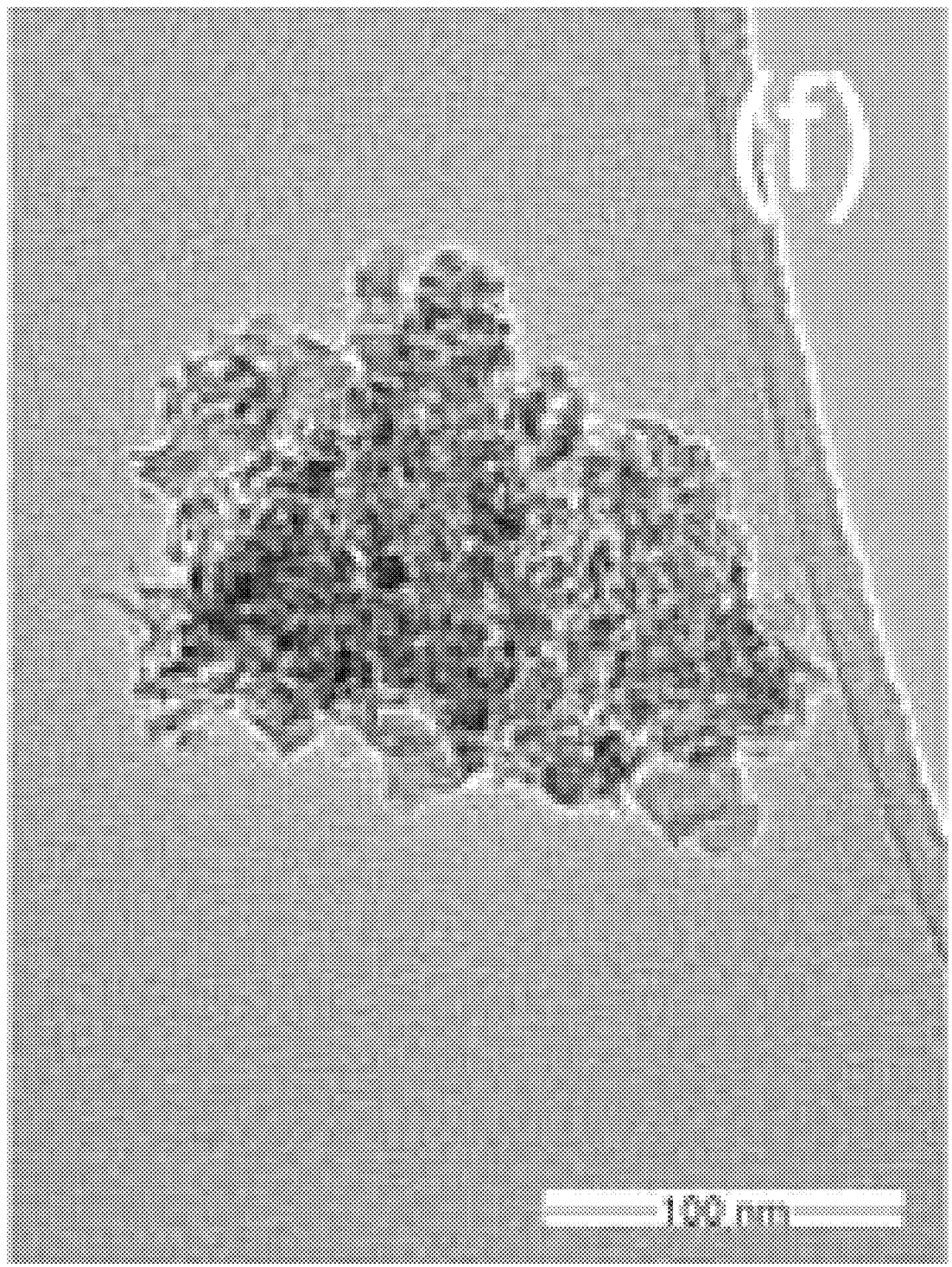

After etching with a catalyst deposited in the HL or LL regime, the structure of the etched porous silicon particles and the structure of particles harvested from the etched particles were completely different, as demonstrated by the electron micrographs shown in FIGS. 3(a)-(f). FIGS. 3(a)-(f) compare typical powder particle structures formed by high-load iMACE (HL-iMACE, panels a-c) and low-load iMACE (LL-iMACE, panels d-f). The HL-iMACE of FIG. 3(a) shows that deposition of 3 mmol Ag per g Si then etching induced by $H_2O_2$ injection led to the formation of uniform, parallel etch track pores. FIG. 3(b) shows that parallel etch track pores with roughly 50-100 nm widths not pillars/ nanowires were formed directly by HL-iMACE. FIG. 3(c) shows ultrasonic agitation cleaved silicon nanowires (elongated structures) from the HL-iMACE-etched substrate. The LL-iMACE image of FIG. 3(d) shows that deposition of 20 μmol Ag per g Si then etching induced by $H_2O_2$ injection led to the formation of smaller randomly oriented pores. FIG. 3(e) shows that randomly oriented pores not pillars/nanowires were formed directly by LL-iMACE. FIG. 3(f) shows ultrasonic agitation cleaves irregular porous nanoparticles from the LL-iMACE-etched substrate.

In the HL regime, Ag atoms redistributed dynamically during etching between the deposited metal structures to form Ag nanoparticles in 50-100 nm range that created parallel etch track pores as they descended into the silicon particles under the influence of etching initiated by the reduction of the injected $H_2O_2$. In the LL regime, Ag atoms redistribution appeared to be much less important. Deposited Ag nanoparticles that were <50 nm created randomly oriented etch track pores as they descended into the silicon particles under the influence of etching initiated by the reduction of the injected $H_2O_2$. The cross sectional images in FIGS. 3(b) and 3(e) conclusively show that the particles are not covered by pillars/nanowires. Indeed, the coverage of silicon pillars/nanowires on all of the particles produced by iMACE under the conditions reported in this document is less than 10%.

The dependence of structural characteristics on the purity of the silicon powder was investigated as detailed in Table 1 below. The pore size distribution and the nature of the pores depended strongly on the impurity level. In both the HL regime and the LL regime, >10 nm etch track pores are formed for all grades of silicon. When using low-resistivity (i.e., highly doped) silicon powder, however, etching far removed from the metal catalyst was observed in addition to etch track pores. This is called remote etching. Remote etching leads to the formation of very small (<10 nm) mesopores. Importantly, the formation of these small pores is also correlated with the observation of visible photoluminescence in the orange to near-infrared range when excited by ultraviolet or blue irradiation. Any sample that is not initially photoluminescent can be made photoluminescent by regenerative electroless etching (ReEtching). The photoluminescence of a LL-iMACE etched sample can be made more intense by regenerative electroless etching (ReEtching).

TABLE 1

| Sample | Particle size, μm | Etch time, min | Yield, % | BET surface area, m²/g | Pore volume, cm³/g |
|---|---|---|---|---|---|
| MG | 44-75 | 30 | 44.4 | 58.1 | 0.235 |
| EG | 44-75 | 30 | 37.9 | 40.1 | 0.177 |
| MG | 11-25 | 90 | 30.0 | 85.4 | 0.244 |
| DW | 11-25 | 90 | 21.0 | 65.2 | 0.134 |
| ESMC10 | 2-10 | 90 | 19.6 | 60.8 | 0.359 |
| ESPS30 | 11-30 | 90 | 66.4 | 33.7 | 0.177 |
| UW | 11-25 | 90 | 25.4 | 22.4 | 0.121 |

Table 1 summarizes the yields, surface areas, and pore volumes for powders milled to different sizes from different Si grades etched in the low load regime (LL-iMACE). The samples were MG—metallurgical grade Si (99.6%, polycrystalline); EG—electronics grade reclaimed wafer chunks; ESMC10—metallurgical grade Si powder (99.999%, polycrystalline); ESPS30—metallurgical grade Si powder (99.999%, polycrystalline); DW—p+ single crystal Si wafer (B-doped, 10-20 mΩ cm); and UW—undoped wafer (>100 $S_2$ cm). The amount of Ag was 0.025 mmol, and the Ag nucleation time was 15 min.

Figure 4:
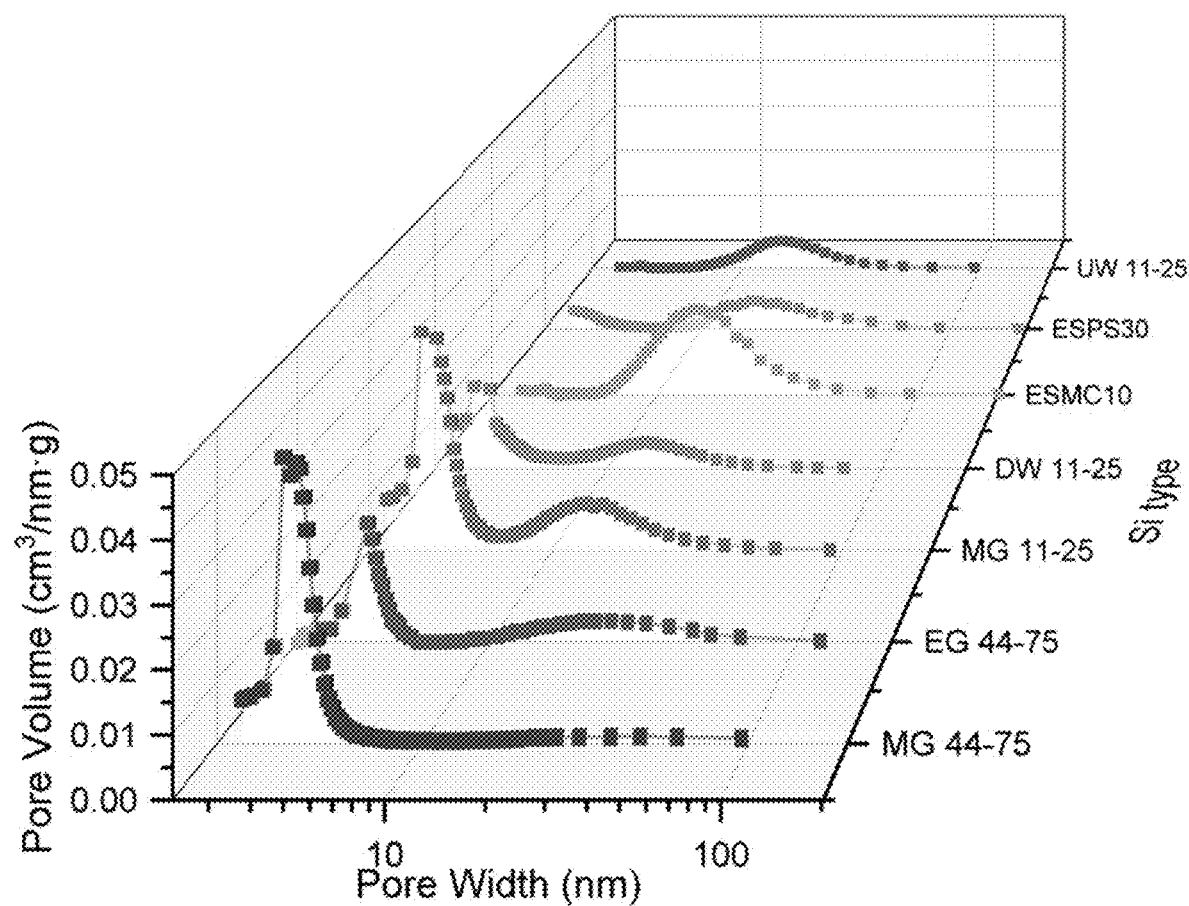
FIG. 4 shows the pore size distribution of different Si powders after LL-iMACE as determined by nitrogen adsorption/desorption isotherm in conjunction with BET and BJH analysis.

As demonstrated in FIG. 4, variation of the impurity/doping level in the silicon powder can be used to create porous silicon with one maximum in the pore size distribution in the 10-100 nm range as the result of etch track pore formation. Alternatively, hierarchically nanostructured porous silicon (hierarchical porous silicon) with a pore size distribution containing two maxima can be created as the result of both etch track pore formation and remote etching.

FIG. 4 shows the pore size distribution of different Si powders after LL-iMACE as determined by nitrogen adsorption/desorption isotherm in conjunction with BET and BJH analysis. For the details of the Si grades and etching parameters see Table 1. Si particles of different sizes and grades as indicated were etched with an etching time of 90 min.

Figure 5A:
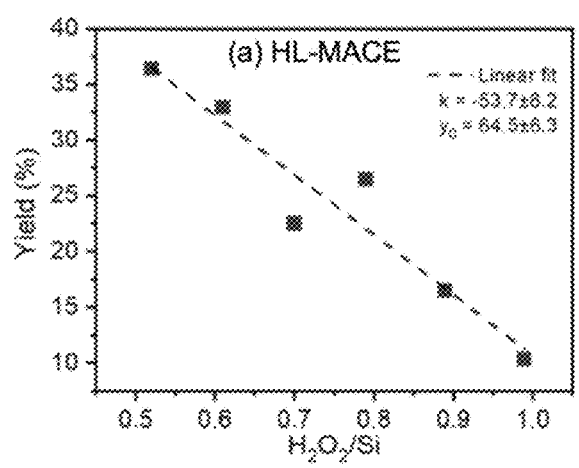
FIGS. 5(a) and 5(b) demonstrates that the HL and LL regimes are characterized by decidedly different yield curves.
Figure 5B:
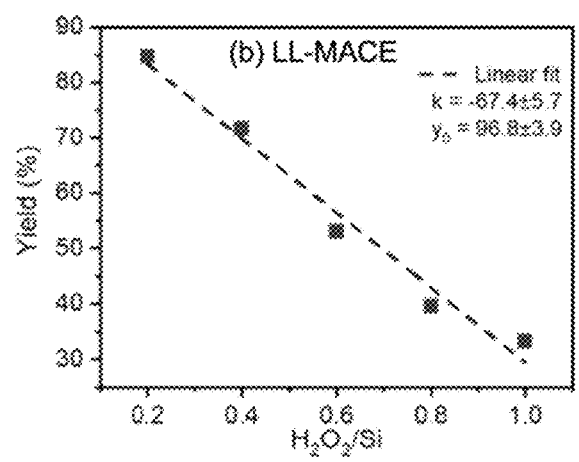

FIGS. 5(a) and 5(b) demonstrate that the HL and LL regimes are characterized by decidedly different yield curves. By introducing the oxidant ($H_2O_2$) with an injection pump the yield was improved and could be systematically varied. The injection time was 40 min for HL-iMACE and 90 min for LL-iMACE. FIG. 5(a) shows, for HL-iMACE, a linear relationship between $H_2O_2$:Si molar ratio and yield was found with a low intercept at zero injected $H_2O_2$ of only 0.65±0.06 due to Si losses incurred by secondary reactions and etching during metal deposition. FIG. 5(b) shows, for LL-iMACE a linear relationship between $H_2O_2$:Si molar ratio and yield was found with an ideal intercept at zero injected $H_2O_2$ of only 0.97±0.04 due to an almost complete lack of Si losses incurred by secondary reactions and etching during metal deposition.

Several aspects of the data in FIGS. 5(a) and 5(b) are important. First, the HL regime has an intrinsically lower yield than the LL regime over the entire range of molar ratios. Second, the HL regime has a lower intercept at a molar ratio of zero, 65±6%, versus the LL regime with an intercept of 97±4%. In other words, the HL regime suffers from an intrinsically lower yield as the result of secondary reactions and etching during metal deposition. Third, the yield at a molar ratio of 0.9 is raised from 1-3% to 17% in the HL regime when the oxidant is injected over 30 min rather than all being added at the beginning of the etch. Fourth, the yield in the LL regime at a molar ratio of 0.9 when the oxidant is injected over 30 min exceeds 30%. Fifth, in both the HL and LL regimes, the yield is improved and can be systematically varied by using injection of the oxidant.

Figure 6A:
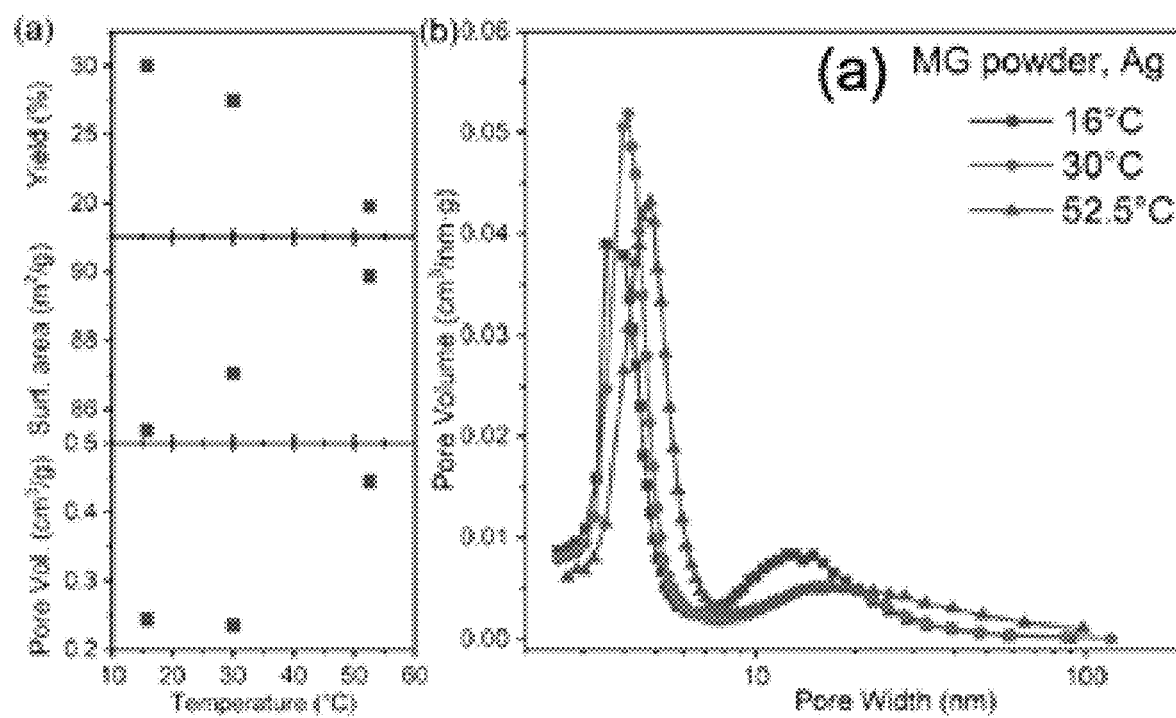
FIGS. 6(a)-(d) show that the yield, pore size distribution, specific surface area, and pore volume in LL-iMACE can be tuned by variation of the temperature, changing the impurity/doping level in Si, and changing the metal used as a catalyst.
Figure 6B:
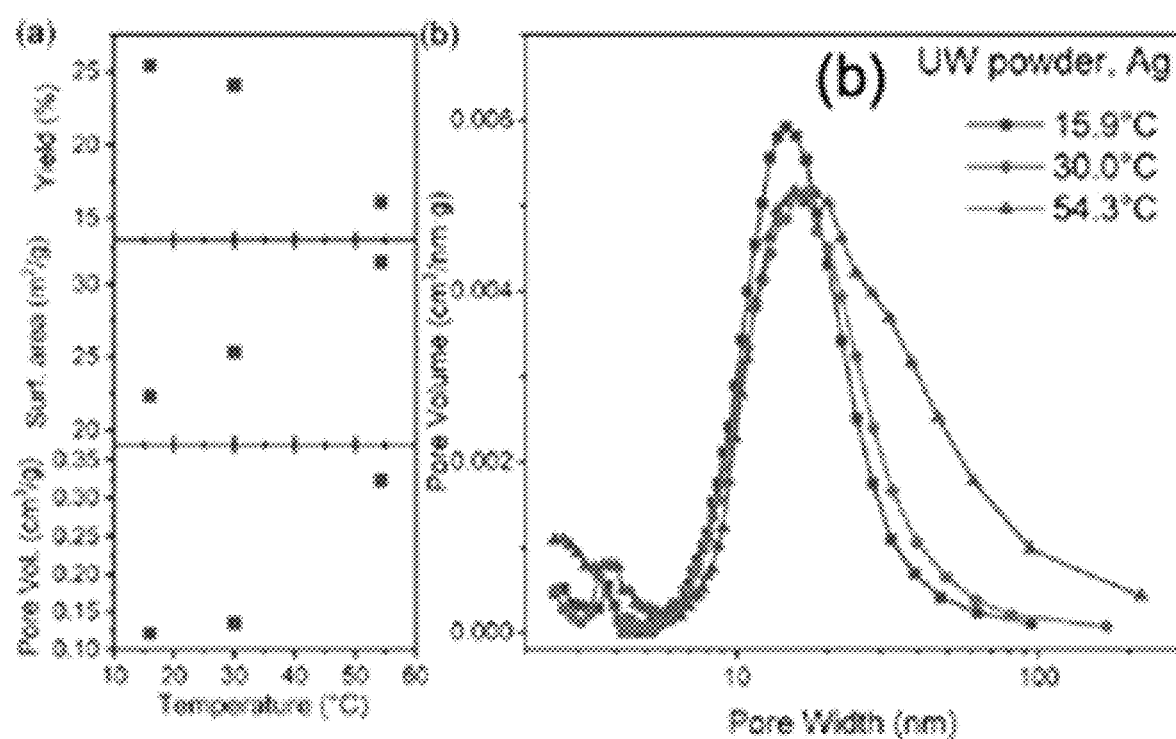
Figure 6C:
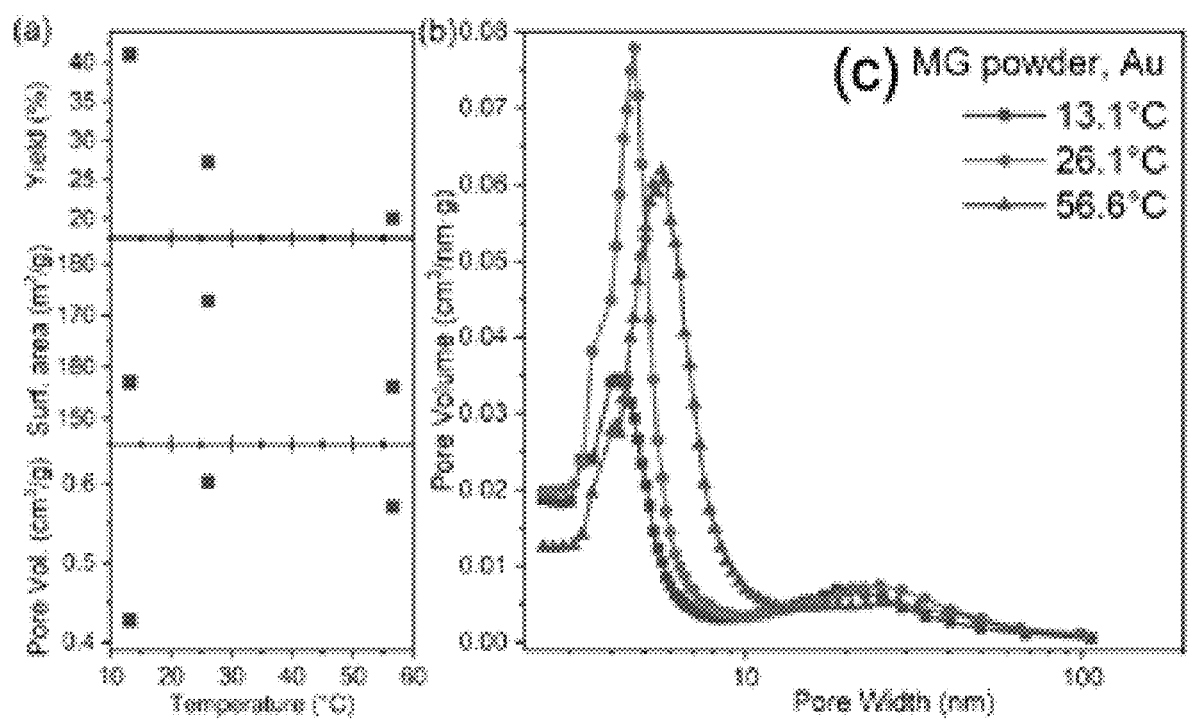
Figure 6D:
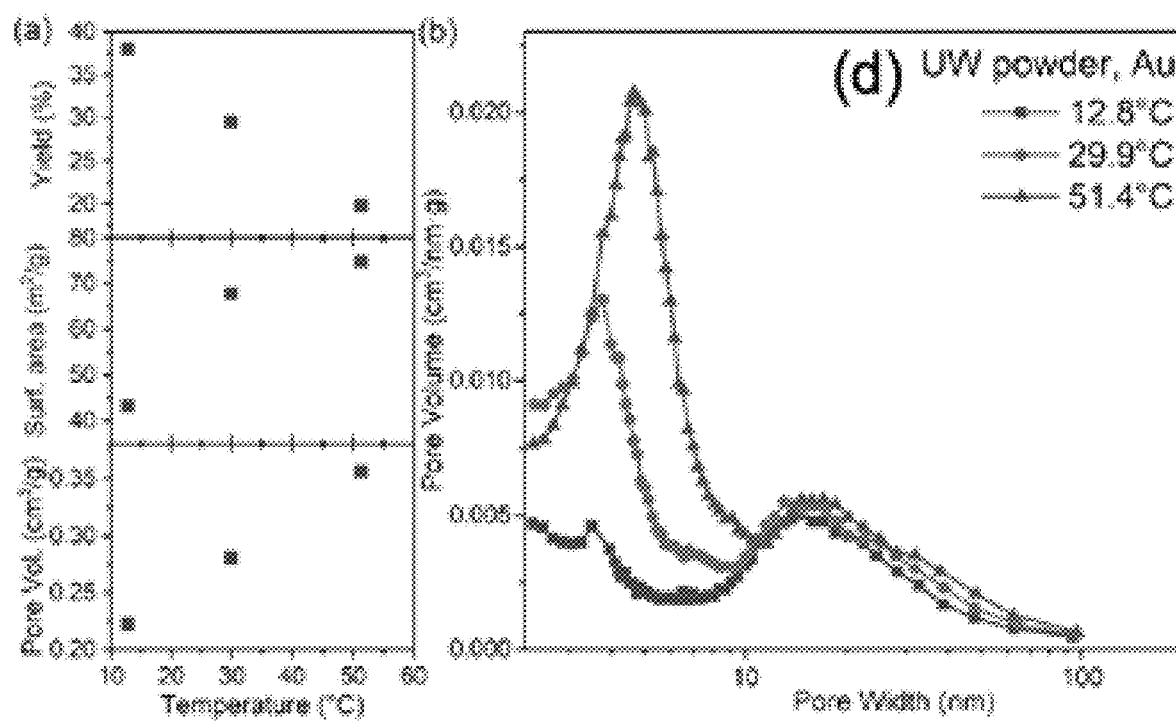

In FIGS. 6(a)-(d), the yield, pore size distribution, specific surface area, and pore volume in LL-iMACE were tuned by variation of the temperature and changing the metal used as a catalyst (MG—metallurgical grade Si (99.6%, polycrystalline); UW—undoped wafer (>100 $S_2$ cm)). The results in FIG. 6(a) and FIG. 6(b) are for a deposited silver (Ag) catalyst. The results in FIG. 6(c) and FIG. 6(d) are for a deposited gold (Au) catalyst.

Figure 7A:
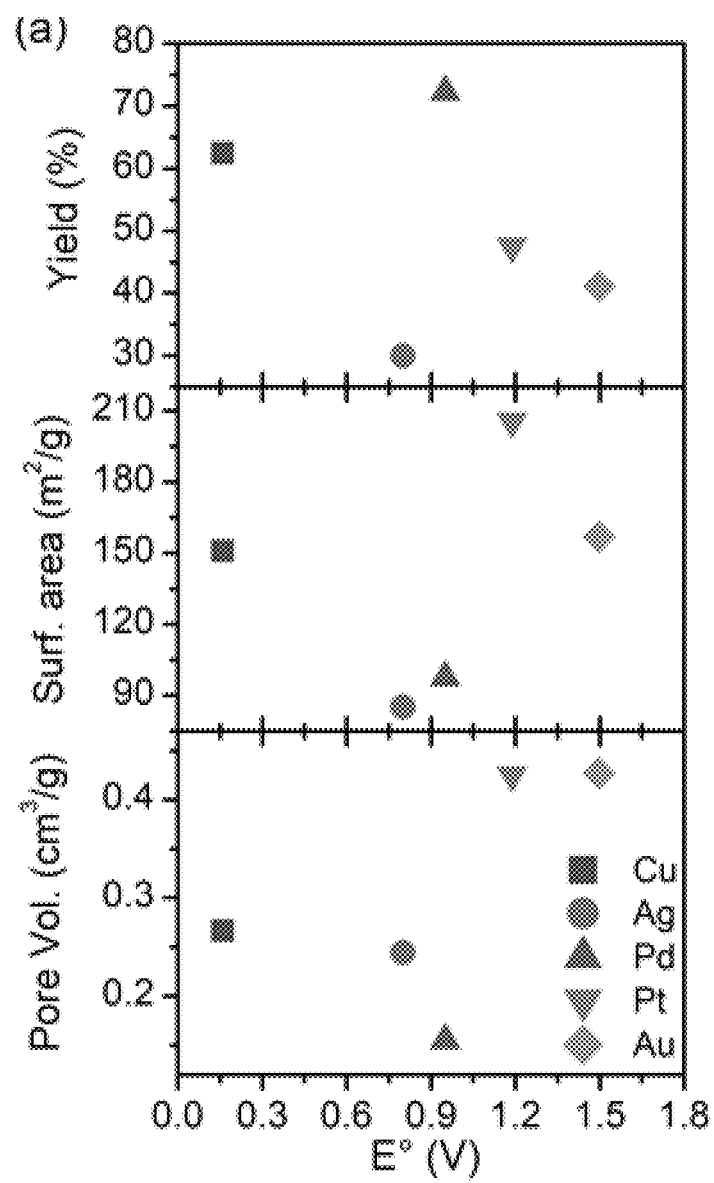
FIGS. 7(a) and 7(b) reflect the effect of the chemical identity of the metal catalyst on yield, BET surface area, and BJH pore volume.
Figure 7B:
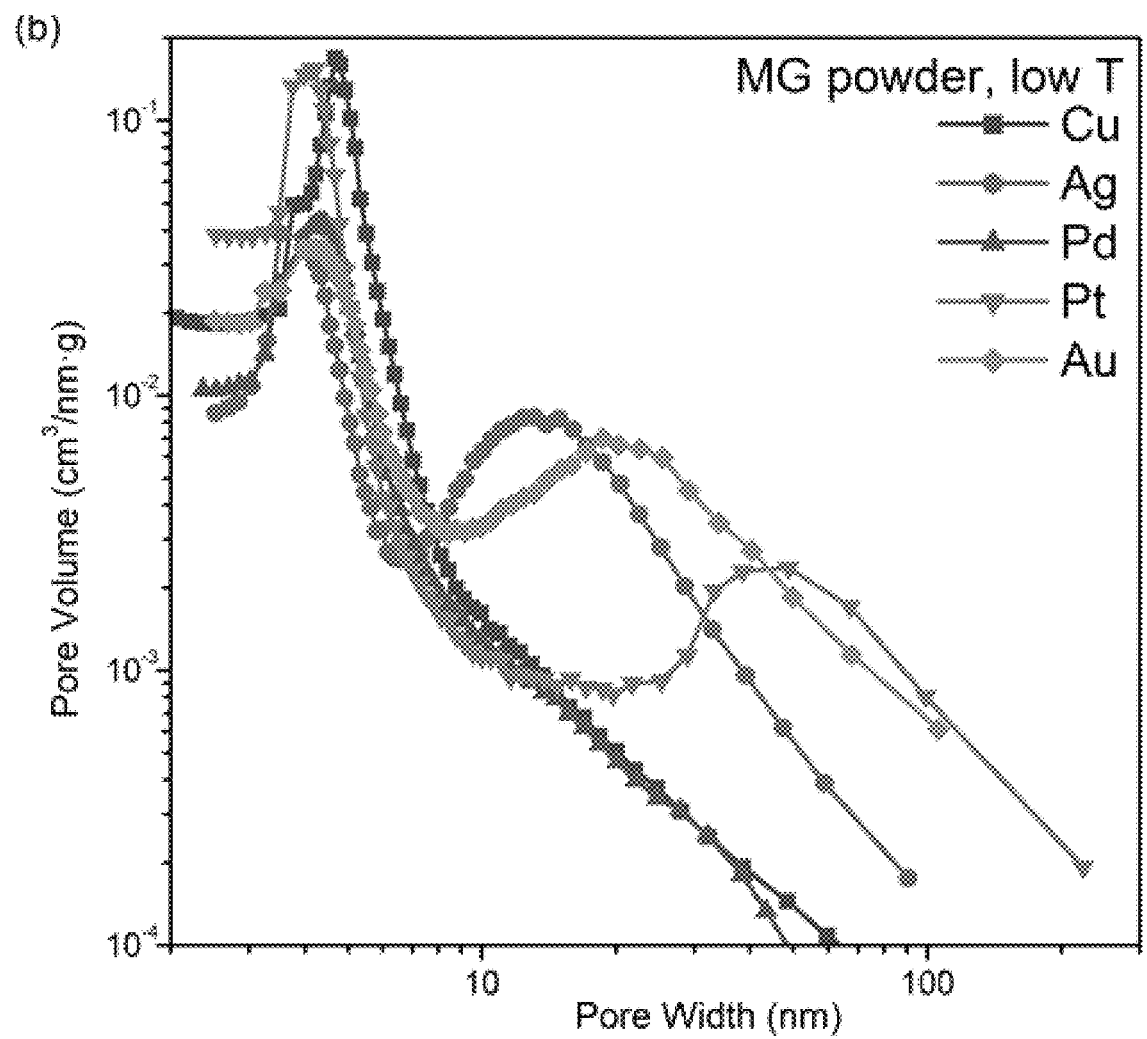

In addition to the temperature at which etching is performed and the grade of the silicon powder, the effect of the chemical identity of the metal catalyst was investigated. As shown in FIGS. 7(a) and 7(b), five different metals, i.e., Cu, Ag, Au, Pd, and Pt, support efficient porosification in the LL-iMACE regime with yields in excess of 35%. Furthermore, by changing the metal catalyst the specific surface area and specific pore volume can be varied. Variation of the temperature during LL-iMACE with the various metals allows for further variations in the pore size distribution, specific surface area and pore volume.

FIG. 7(a) depicts the dependence of yield, BET surface area, and BJH pore volume from the metal catalyst used in LL-MACE of 11-25 μm MG Si powders. The x axis shows the reduction potentials of the metal ions. FIG. 7(b) depicts BJH pore size distributions for the etched powders. Copper (Cu), silver (Ag), gold (Au), palladium (Pd), and platinum (Pt) all support porosification of the silicon powder. FIG. 7(a) demonstrates yield in excess of 30% with the use of all five metal catalysts; specific surface areas in the range of roughly 90-210 $m^2$ $g^{-1}$ can be achieved; and specific pore volumes of roughly 0.15 to 0.44 $cm^2$ $g^{-1}$ can be achieved.

TABLE 2

| Metal | Average size of small pores, nm | Average size of large pores, nm | Total pore volume, $cm^3/g$ |
|---|---|---|---|
| Ag | 4.32 | 24.19 | 0.358 |
| Pd | 4.81 | — | 0.212 |
| Pt | 4.33 | — | 0.405 |
| Au | 4.66 | 18.16 | 0.431 |
| Cu | 4.54 | — | 0.267 |

Table 2 summarizes the average pore sizes and pore volumes calculated from pore size distributions for various metals used to catalyze LL-iMACE. The values displayed were derived from the same set of $N_2$ adsorption data used to generate the graphs shown in FIGS. 7(a) and 7(b). Pore volume data for small pores were taken for sizes that are smaller than the local minimum (~9 nm for Ag and Au etched samples). Data points for large pores were taken after the local minimum.

The following paragraphs summarize some of the embodiments of the present invention.

Disclosed is a process of producing porosified and/or hierarchical silicon comprising particles from electronics-grade, metallurgical-grade, or other silicon-comprising powders in which injection of an oxidant is used to initiate catalytic reduction of the oxidant at a deposited metal nanoparticle and in which the reduction initiates nanostructure formation. Oxidants include, but are not limited to, $H_2O_2$, $VO_2^+$ (from, e.g., dissolved $V_2O_5$), $Ce^{4+}$, nitrates including $HNO_3$ and $Fe(NO_3)_3$, nitrites, $NO_2$, $NOBF_4$, $NOHSO_4$, $MnO_4$, dihalogens including $Br_2$ and $I_2$, halogenates including $IO_3^-$, $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

Also disclosed is a process to produce porosified and/or hierarchical silicon comprising particles from electronics-grade, metallurgical-grade, or other silicon-comprising powders that exhibit visible to near-infrared luminescence in which injection of an oxidant is used to initiate catalytic reduction of the oxidant at a deposited metal nanoparticle and in which the reduction initiates nanostructure formation. Oxidants include, but are not limited to, $H_2O_2$, $VO_2^+$ (from, e.g., dissolved $V_2O_5$), $Ce^{4+}$, nitrates including $HNO_3$ and $Fe(NO_3)_3$, nitrites, $NO_2$, $NOBF_4$, $NOHSO_4$, $MnO_4$, dihalogens including Bra and $I_2$, halogenates including $IO_3^-$, $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

A process is further disclosed to produce porosified and/or hierarchical silicon-comprising particles from electronics-grade, metallurgical-grade, or other silicon-comprising powders in which injection of $H_2O_2$ is used to introduce $H_2O_2$ that is catalytically reduced and in which Ag, Au, Cu, Pd, or Pt act as the catalyst that initiates nanostructure formation.

A process is further disclosed to produce porosified and/or hierarchical silicon-comprising particles from electronics-grade, metallurgical-grade, or other silicon-comprising powders that exhibit visible to near-infrared luminescence in which injection of $H_2O_2$ is used to introduce $H_2O_2$ that is catalytically reduced and in which Ag, Au, Cu, Pd, or Pt act as the catalyst that initiates nanostructure formation.

Further disclosed is a process to produce porosified and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders in which injection of an oxidant is used to initiate catalytic reduction of the oxidant at a deposited metal nanoparticle and in which the reduction initiates nanostructure formation.

Still further disclosed is a process to produce porosified and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders that exhibit visible to near-infrared luminescence in which injection of an oxidant is used to initiate catalytic reduction of the oxidant at a deposited metal nanoparticle and in which the reduction initiates nanostructure formation.

Another disclosed process produces porosified and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders in which injection of $H_2O_2$ is used to introduce $H_2O_2$ that is catalytically reduced and in which Ag, Au, Cu, Pd, or Pt act as the catalyst that initiates nanostructure formation.

Yet another disclosed process produces porosified, pillared, and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders that exhibit visible to near-infrared luminescence in which injection of $H_2O_2$ is used to introduce $H_2O_2$ that is catalytically reduced and in which Ag, Au, Cu, Pd, or Pt act as the catalyst that initiates nanostructure formation.

Disclosed is a process according to any one of the preceding summary paragraphs of producing porous silicon powder particles that are porosified completely through for particles with a thickness of smaller than and greater than 4 μm, up to at least 75 μm.

Disclosed is a process according to any one of the preceding summary paragraphs of producing porous silicon powders with a porous layer thickness of over 35 μm on each side of a particle for particles with an initial thickness of greater than 75 μm.

Disclosed is a process according to any one of the preceding summary paragraphs of producing porous semiconductor powder particles that are porosified completely through for particles with a thickness of smaller than and greater than 4 μm, up to at least 75 μm.

Disclosed is a process according to any one of the preceding summary paragraphs of producing porous semiconductor powders with a porous layer thickness of over 35 μm on each side of a particle for particles with an initial thickness of greater than 75 μm.

Disclosed is a process according to any one of the preceding summary paragraphs of producing porous silicon-comprising powder particles that are porosified completely through for particles with a thickness of smaller than and greater than 4 μm, up to at least 75 μm.

Disclosed is a process according to any one of the preceding summary paragraphs of producing porous silicon-comprising powders with a porous layer thickness of over 35 μm on each side of a particle for particles with an initial thickness of greater than 75 μm.

Disclosed is a process according to any one of the preceding summary paragraphs of producing hierarchical porous silicon in which HL-iMACE or LL-iMACE is used to create luminescent or non-luminescent porous silicon and ReEtching is used to introduce smaller pores within the walls of the larger pores.

Disclosed is a process according to any one of the preceding summary paragraphs of producing hierarchical porous silicon in which HL-iMACE or LL-iMACE is used to create luminescent or non-luminescent porous silicon and ReEtching is used to introduce luminescence centers.

Disclosed is a process according to any one of the preceding summary paragraphs of producing porous silicon powders with specific surface areas in the range of 0.42 to 210 $m^2\ g^{-1}$, as measured by the BET method.

Disclosed is a process according to any one of the preceding summary paragraphs of producing porous silicon powders with specific pore volumes in the range of 0.12 to 1.1 $cm^3\ g^{-1}$, as measured by the BET method together with Barrett-Joyner-Halenda (BJH) theory.

Disclosed is a process according to any one of the preceding summary paragraphs of producing porous silicon powders in which pillars/nanowires cover less than 10% of any individual particle.

Also disclosed is a process to produce porosified and/or hierarchical silicon-comprising particles from electronics-grade, metallurgical-grade, or other silicon-comprising powders in which continuous addition of an oxidant is used to control the rate of electroless etching, for example, stain etching, ReEtching, or metal assisted catalyzed etching (MACE), independent of the extent of electroless etching. Oxidants include, but are not limited to, $H_2O_2$, $VO_2^+$ (from, e.g., dissolved $V_2O_5$), $Ce^{4+}$, nitrates including $HNO_3$ and $Fe(NO_3)_3$, nitrites, $NO_2$, $NOBF_4$, $NOHSO_4$, $MnO_4$, dihalogens including $Br_2$ and $I_2$, halogenates including $IO_3^-$, $IrCl_6^{2-}$, $Fe^{3+}$, $S_2O_8^{2-}$, $HCrO_4$, $ClO_4^-$, $Co^{3+}$, $Ru(CN)_6^{3-}$, or $UO_2^+$.

Disclosed is a process to produce porosified and/or hierarchical silicon-comprising particles from electronics-grade, metallurgical-grade, or other silicon-comprising powders in which injection of an oxidant is used to control the rate of electroless etching, for example, metal assisted catalyzed etching (MACE), independent of the extent of electroless etching, and in which the pore size distribution, specific surface area, and pore volume can be tuned by varying one or more of etch time, the amount of oxidant (more specifically the oxidant to silicon molar ratio), the chemical identity of the metal catalyst, the doping/impurity level of the silicon, the reaction temperature, and post-etching parameters including drying technique.

Also disclosed is a process to produce porosified and/or hierarchical semiconductor-comprising particles from electronics-grade, metallurgical-grade, or other semiconductor-comprising powders in which continuous addition of an oxidant is used to control the rate of electroless etching, for example, stain etching, ReEtching, or metal assisted catalyzed etching (MACE), independent of the extent of electroless etching. Oxidants include, but are not limited to, $H_2O_2$, $VO_2^+$ (from, e.g., dissolved $V_2O_5$), $Ce^{4+}$, nitrates including $HNO_3$ and $Fe(NO_3)_3$, nitrites, $NO_2$, $NOBF_4$, $NOHSO_4$, $MnO_4$, dihalogens including $Br_2$ and $I_2$, halogenates including $IO_3^-$, $IrCl_6^{2-}$, $Fe^{3+}$, $S_2O_8^{2-}$, $HCrO_4$, $ClO_4^-$, $Co^{3+}$, $Ru(CN)_6^{3-}$, or $UO_2^+$.

Disclosed is a process to produce porosified and/or hierarchical semiconductor-comprising particles from electronics-grade, metallurgical-grade, or other semiconductor-comprising powders in which injection of an oxidant is used to control the rate of electroless etching, for example, metal assisted catalyzed etching (MACE), independent of the extent of electroless etching, and in which the pore size distribution, specific surface area, and pore volume can be tuned by varying one or more of etch time, the amount of oxidant (more specifically the oxidant to silicon molar ratio), the chemical identity of the metal catalyst, the doping/impurity level of the silicon, the reaction temperature, and post-etching parameters including drying technique.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also expressly intended that the steps of the processes disclosed are not restricted to any particular order, unless otherwise noted above.

What is claimed is:

1. A process to improve control of electroless etching to produce porosified or hierarchical silicon particles comprising the steps of:
   (a) providing electronics-grade, metallurgical-grade, or other silicon-comprising powders;
   (b) adding a first oxidant, which deposits on the powder as a metal catalyst for electroless etching; by injecting via a pump a first solution containing a soluble form of the metal catalyst by controlling an injection rate to facilitate metal loading with an even deposition of the metal catalyst, having a controlled coverage between 0.024 mmol and 0.6 mmol per square meter with respect to a surface area of the silicon-comprising powder before etching;
   (c) initiating electroless etching to engender nanostructure formation through injection with a controlled rate and amount of a second solution containing a second oxidant; and
   (d) wherein the nanostructure formation defines a pore size distribution with a mean pore size of between 4.3 nm and 24.2 nm and a BJH pore volume of 0.12-1.1 $cm^3/g$.

2. The process according to claim 1, wherein the second oxidant is selected from $H_2O_2$, $VO_2^+$, $Ce_4^+$, nitrates, nitrites, $NO_2$, $NOBF_4$, $NOHSO_4$, $MnO_4$, dihalogens, and halogenates.

3. The process according to claim 1, wherein the metal catalyst is Ag, Au, Pd, Pt, Rh, Ir, TI, W, Re, Bi, Cu, Po, or Ru.

4. The process according to claim 1, wherein particles are produced that are porosified completely through for particles with a thickness of up to about 75 μm.

5. The process according to claim 1, wherein particles are produced that have a porous layer thickness of over 35 μm on each side of a particle for particles with an initial thickness of greater than 75 μm.

6. The process according to claim 1 with a yield in excess of 15%, wherein etching leads directly to porous or hierarchical porous silicon production in which pillars/nanowires cover less than 10% of individual particles.

7. The process according to claim 1 with a yield in excess of 15%, wherein chilled acetic acid is used during metal loading and etching steps to enhance uniformity of metal deposition, the yield of etched silicon, and minimization of structural damage caused by gas bubble formation and capillary forces.

8. The process of claim 1, wherein the pore size distribution is further defined by a BET specific surface area of 0.42-210 $m^2$/g.

9. The process of claim 1, wherein the process is performed under a temperature control of between 12° C. and 57° C.

10. The process according to claim 1 with a yield in excess of 15%, wherein the metal loading is reduced to between 0.024 mmol per square meter and 0.6 mmol per square meter with respect to the surface area of the silicon-comprising powder before etching.

11. The process according to claim 10 with a yield in excess of 30%, wherein etching leads directly to porous or hierarchical porous silicon production in which pillar/nanowires cover less than 10% of individual particles.

12. The process according to claim 10 with a yield in excess of 30%, wherein pore size distribution, specific surface area, and pore volume can be tuned by varying one or more of etch time, amount of oxidant, chemical identity of the metal catalyst, doping or impurity level of the silicon, reaction temperature, and post-etching parameters including drying technique.

13. The process according to claim 10 with a yield in excess of 30%, wherein chilled acetic acid is used during metal loading and etching steps to enhance uniformity of metal deposition, to enhance the yield of etched silicon, and to minimize structural damage caused by gas bubble formation and capillary forces.

14. The process according to claim 10 with a yield in excess of 30%, wherein particles are produced that have specific surface areas in a range of 0.42 to 210 square meters per gram as measured by Brunauer-Emmett-Teller method.

15. The process according to claim 10 with a yield in excess of 30%, wherein particles are produced that have specific pore volumes in a range of 0.12 to 1.1 cubic centimeters per gram, as measured by Brunauer-Emmett-Teller method together with Barrett-Joyner-Halenda theory.

* * * * *